United States Patent [19]

Ho et al.

[11] 4,276,558
[45] Jun. 30, 1981

[54] HERMETICALLY SEALED ACTIVE MICROWAVE INTEGRATED CIRCUIT

[75] Inventors: Pang T. Ho, Mountain View; Michael D. Rubin, Saratoga, both of Calif.

[73] Assignee: Ford Aerospace & Communications Corp., Detroit, Mich.

[21] Appl. No.: 48,872

[22] Filed: Jun. 15, 1979

[51] Int. Cl.³ .................... H01L 23/02; H01L 23/12; H01L 39/02

[52] U.S. Cl. .................................. 357/74; 357/80; 357/81; 333/247

[58] Field of Search ............................ 357/74, 81, 80; 333/245, 246, 247

[56] References Cited

U.S. PATENT DOCUMENTS

| | | | |
|---|---|---|---|
| 3,611,059 | 10/1971 | Carley | 357/74 |
| 3,705,255 | 12/1972 | Low et al. | 357/74 |
| 3,745,487 | 7/1973 | Milard et al. | 357/74 |
| 3,828,228 | 8/1974 | Wong et al. | 357/81 |
| 3,898,594 | 8/1975 | Hochberg et al. | 357/81 |
| 3,908,188 | 9/1975 | Kawamoto | 357/81 |
| 3,943,556 | 3/1976 | Wilson | 357/81 |
| 4,183,041 | 1/1980 | Goel | 357/81 |

*Primary Examiner*—Andrew J. James
*Attorney, Agent, or Firm*—Paul K. Godwin, Jr.; Clifford L. Sadler

[57] ABSTRACT

An active microwave amplifier element is hermetically sealed on the opposite side of a dielectric substrate from the side in which input and output signals are transmitted. The active element is mounted on a ground plane and is electrically connected to coplanar waveguide elements which are coplanar with the ground plane. The coplanar waveguide elements are electrically connected to associated microwave strips through the dielectric substrate and said holes are also sealed. A cap having similar coefficient of thermal expansion to the dielectric substrate is mounted on the ground plane to enclose and hermetically seal the active element.

9 Claims, 3 Drawing Figures

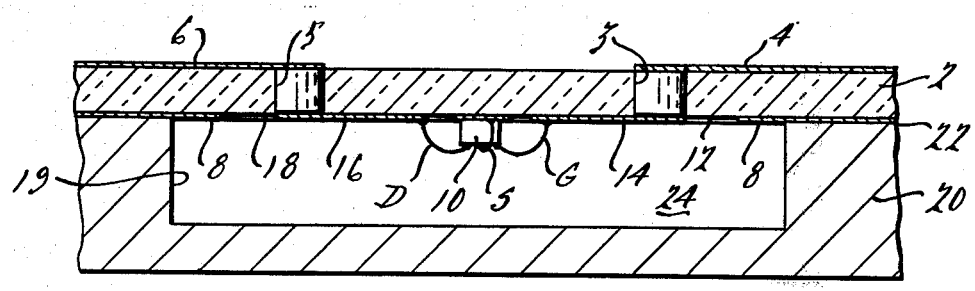
FIG. 1.
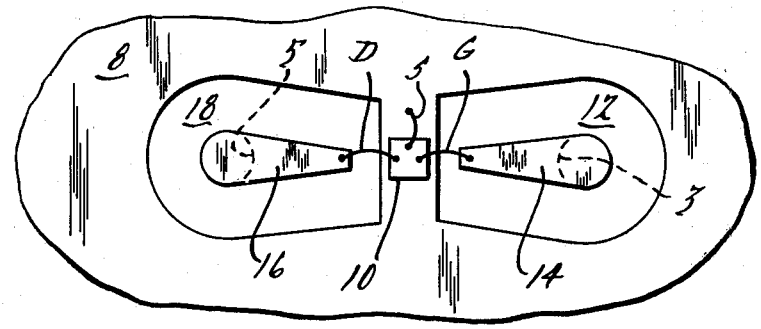
FIG. 2.
FIG. 3.
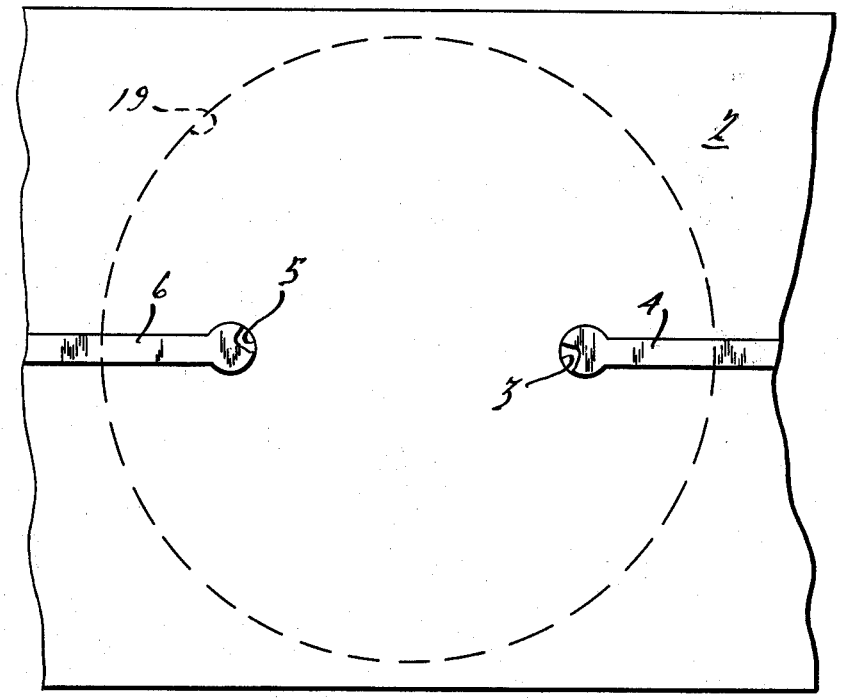

HERMETICALLY SEALED ACTIVE MICROWAVE INTEGRATED CIRCUIT

BACKGROUND OF THE INVENTION

1. Field of the Invention

The present invention is related to active radio freqency elements and techniques for packaging said elements so as to improve operation and reliability characteristics.

2. Description of the Prior Art

Many attempts have been made to develop radio frequency band amplifiers that are low in noise, rugged and immune to the environment. However, the design of most prior devices have apparently required certain trade offs to obtain devices suitable for particular uses.

U.S. Pat. Nos. 3,784,883, 3,908,185 and 3,958,195 are each directed to providing devices hermetically sealed in packages to protect them from the environment. However, each of the devices disclosed in the aforementioned patents incorporate sealing techniques which inherently introduce significant parasitic impedances into the operation of the devices at high frequencies.

For instance, U.S. Pat. No. 3,784,883 shows a transistor die mounted on an output microstrip line that is metalized onto a ceramic wafer. An input microstrip line is diametrically opposed to the output microstrip across a gap and is also metalized onto the ceramic wafer. A ceramic cap is mounted in contact with both the input and output microstrips so as to enclose the transistor die.

In U.S. Pat. No. 3,908,185, a semiconductor pellet is shown mounted on an isolated metalized island layer. A grounded metalized layer surrounds the island. The pellet is shown with its base wired to the grounded layer; the collector connected to the island; the island wired to an output lead; and the emitter wired to an input lead. An annular spacer of Al$_2$O$_3$ surrounds the semiconductor pellet and is located on the grounded layer. The upper surface of this spacer contains input and output lead extension layers to which the aforementioned collector and emitter wires are connected. A high temperature glass sealing ring provides the sealant between the upper surface of the spacer and a ring to support a stainless steel cap.

In U.S. Pat. No. 3,958,195 a transistor package is shown which includes a generally planar ground plane metalization surrounding a transistor mounting pad supporting a transistor die. An electrically insulative aperture spacer plate is disposed over the ground plane structure with the aperture of the spacer in registration over the transistor. The input and output lead structures are disposed overlaying the aperture spacer so that the input and output lead structures extend across the spacer and intersect with the aperture. The common lead structure extends across the spacer adjacent the aperture, as does the input and output leads. Interconnect leads interconnect the leads overlaying the spacer with the underlying ground plane and transistor electrodes through the aperture in the spacer. A ceramic cap is sealed over the aperture and is in contact with the common, input and output leads.

SUMMARY OF THE INVENTION

The embodiment of the invention described herein, was conceived during development of solid state microwave amplifiers wherein high reliability and performance characteristics were desired along with low noise and high gain features. It was, of course, recognized that hermetically sealed devices were conventional but that most known packaging techniques introduced parasitic impedances which would be detrimental to electrical performance in a microwave amplifier. It was further recognized that, at microwave frequencies, the electrical performance of active devices in chip form have always been superior to the same device mounted in a hermetically sealed package.

In the disclosed embodiment of the present invention, an FET is employed as the active element and is mounted on a ground plane conductive layer metalized onto a substrate dielectric. Coplanar waveguides are formed on the same surface of the dielectric substrate as the ground plane conductor, and are separated from the ground plane conductor by surrounding field channels. When the FET is connected as an r.f. amplifier element, its gate is connected to one of the coplanar waveguide elements, its drain is connected to the other of the coplanar waveguide elements, and its source is connected to the ground plane conductor. Input and output signals are transmitted along microstrips which are mounted in a line on the opposite side of the substrate dielectric and are interconnected with the respective coplanar waveguide elements via feed-through holes in the substrate dielectric. The feed-through holes are solder filled to provide electrical connection between the coplanar waveguide elements and associated microstrips and to provide a hermetic seal. A metalized cap is soldered to the ground plane over the transistor element so as to provide a hermetic seal to the transistor element.

Therefore, a principle object of the present invention is to provide an improved packaging concept for active radio frequency elements, wherein no parasitic impedences are introduced as a result of the package.

Another object of the present invention is to provide coplanar waveguide transmission lines to a hermetically sealed active element of a broad band r.f. amplifier.

A further object of the present invention is to provide an active element connected to coplanar waveguide transmission lines that may be tuned by addition of series or shunt tuning elements.

BRIEF DESCRIPTION OF THE DRAWINGS

FIG. 1 is a cross-sectional plan view of the composite structure of one embodiment of the present invention.

FIG. 2 is a bottom view of the composite structure shown in FIG. 1 with the metalized cap 20 removed.

FIG. 3 is a top view of the composite structure shown in FIG. 1.

DESCRIPTION OF THE PREFERRED EMBODIMENT

The following discussion is made with co-reference to FIGS. 1, 2 and 3.

A dielectric substrate 2 carries an input microstrip 4 and an output microstrip 6 which are metalized, preferably in a colinear arrangement, on the upper surface thereof. A ground plane conductor 8 is a metalized layer which is deposited on the lower surface of the dielectric substrate 2 in association with the input and output microstrips 4 and 6, respectively. An active semiconductor element, such as an FET, is mounted directly on the ground metalization layer 8 and has its source connected thereto in order to minimize the source to ground inductance. A coplanar waveguide element 14 is formed on the lower surface of the dielectric substrate 2 and is separated from the ground plane conductor 8 by a coplanar field channel 12.

The coplanar waveguide element 14 is connected via a lead wire "G" to the gate of the semiconductor element 10. The opposite end of the coplanar waveguide element 14 directly underlies the end point of the input microstrip 4 along a line orthogonal to the surfaces of the dielectric substrate 2. A feed-through hole 3 is filled with electrically conductive material such as solder to interconnect the input microstrip 4 with the coplanar waveguide 14 and at the same time provide a hermetic seal between the lower surface and the upper surface of the dielectric substrate 2.

Similarly, a coplanar waveguide element 16 is formed on the opposite side of the semiconductor element 10 and is separated by a field channel 18 from the coplanar ground plane 8. The drain of the semiconductor element 10 is connected via a lead wire "D" to the coplanar waveguide 16. The opposite end of the coplanar waveguide 16 underlies the end point of the output microstrip 6 and is electrically connected to the output microstrip 6 via a feed-through hole 5, the feed-through hole 5, like hole 3, is also filled with an electrically conducting material such as solder.

A cap 20 is formed of an electrically conductive material, such as gold plated Kovar, and may also be employed as a substrate carrier. The cap 20 has a hollow portion 24 with side walls 19 and is electrically connected as well as hermetically sealed at 22 to the ground plane conductor 8. Kovar is selected as the cap material in those instances where $Al_2O_3$ is employed as the dielectric substrate 2, so as to match its thermal expansion characteristics.

The aforementioned configuration has been found to be highly suited for broadband amplifiers in the microwave frequency region, since the construction does not introduce additional parasitics and may be readily tuned by the addition of series or shunt elements to the coplanar waveguide elements. Such tuning may be formed into the coplanar waveguide elements prior to installation of the protective cap 20. If additional fine tuning is required, this may be accomplished at the microstrips 4 and 6.

It will be apparent that many modifications and variations may be effected without departing from the scope of the novel concept of this invention. For example, the feed through holes may be filled with materials other than solder. Also, the concept of the invention is not limited to a single device or type of device. More than one transistor, either field effect or bipolar, or semiconductor diode or other suitable microwave semiconductor device(s) can be used in this package. Therefore, it is intended by the appended claims to cover all such modifications and variations which fall within the true spirit and scope of the invention.

We claim:

1. A radio frequency transistor package including:
a substrate having first and second opposing surfaces;
a signal input microstrip mounted on said first surface of said substrate;
a signal output microstrip mounted coplanar with said signal input microstrip on said first surface of said substrate;
a conductor mounted on said second surface of said substrate defining a ground plane for said input and output microstrips;
a radio frequency transistor mounted on said ground plane conductor;
a first coplanar waveguide element mounted on said second surface adjacent said radio frequency transistor coplanar with said ground plane conductor;
a second coplanar waveguide element mounted on said second surface adjacent said radio frequency transistor coplanar with said ground plane conductor;
said first and second coplanar waveguides each being surrounded by said ground plane conductor and separated therefrom by a field channel;
said transistor being electrically connected to said first and second coplanar waveguide elements.

2. A radio frequency transistor as in claim 1, wherein said transistor is an FET type having a gate connected to said first coplanar waveguide element, a drain connected to said second coplanar waveguide element and a source connected to said ground plane conductor.

3. A radio frequency transistor package as in claim 2, wherein said cap is formed of an electrically conductive material and is electrically connected to said ground plane conductor.

4. A radio frequency transistor package as in claim 1, wherein said cap is formed of an electrically conductive material and is electrically connected to said ground plane conductor.

5. In a radio frequency circuit employing microstrip waveguides electrically connected to an active semiconductor element mounted on a substrate dielectric, an improvement comprising:
microstrips mounted on a first surface of said substrate dielectric;
a conductor mounted on the opposite surface of said substrate dielectric defining a ground plane for said microstrips;
a plurality of coplanar waveguide elements mounted on said opposite surface of said substrate dielectric coplanar with and insulated from said ground plane conductor by corresponding field channels;
said semiconductor element mounted on said ground plane conductor;
said semiconductor element being electrically connected to respective ones of said coplanar waveguide elements and through said substrate dielectric to said microstrips; and
an electrically conducting housing mounted on said ground plane conductor so as to be at an equipotential therewith and to hermetically enclose said semiconductor element.

6. An improved radio frequency circuit as in claim 5, wherein said housing is soldered to said ground plane conductor to provide electrical grounding of said housing.

7. An improved radio frequency circuit as in claim 5, wherein each coplanar waveguide element overlaps a portion of a corresponding microstrip along a line orthogonal to said substrate dielectric.

8. An improved radio frequency circuit as in claim 7, wherein said substrate dielectric includes feed-through holes to provide electrical communication between said coplanar waveguide elements and said corresponding microstrips along said orthogonal lines.

9. An improved radio frequency circuit as in claim 8, wherein said feed-through holes are filled to provide a hermetic seal between the semiconductor element within said housing and the first surfaces of said substrate dielectric.

* * * * *